(12) United States Patent
Fujiwara

(10) Patent No.: US 8,975,760 B2
(45) Date of Patent: Mar. 10, 2015

(54) SEMICONDUCTOR DEVICE REDUCING RISKS OF A WIRE SHORT-CIRCUIT AND A WIRE FLOW

(75) Inventor: Shori Fujiwara, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 23 days.

(21) Appl. No.: 13/561,793

(22) Filed: Jul. 30, 2012

(65) Prior Publication Data

US 2013/0037941 A1 Feb. 14, 2013

(30) Foreign Application Priority Data

Aug. 10, 2011 (JP) ................................. 2011-174576

(51) Int. Cl.
*H01L 23/00* (2006.01)
*H01L 25/065* (2006.01)
(Continued)

(52) U.S. Cl.
CPC ................ *H01L 24/97* (2013.01); *H01L 24/48* (2013.01); *H01L 24/49* (2013.01); *H01L 24/85* (2013.01); *H01L 25/0655* (2013.01); *H01L 25/0657* (2013.01); *H01L 25/50* (2013.01); *H01L 2224/49426* (2013.01); *H01L 23/3128* (2013.01); *H01L 24/29* (2013.01); *H01L 24/32* (2013.01); *H01L 24/45* (2013.01); *H01L 24/83* (2013.01); *H01L 2224/2919* (2013.01); *H01L 2224/32145* (2013.01); *H01L 2224/32225* (2013.01); *H01L 2224/45144* (2013.01); *H01L 2224/45147* (2013.01); *H01L 2224/48227* (2013.01); *H01L 2224/48228* (2013.01); *H01L 2224/48465* (2013.01); *H01L 2224/48471* (2013.01); *H01L 2224/48479* (2013.01); *H01L 2224/4911* (2013.01); *H01L 2224/49112* (2013.01);
(Continued)

(58) Field of Classification Search
USPC .......................... 257/777, 748, 737, 784, 786
See application file for complete search history.

(56) References Cited

U.S. PATENT DOCUMENTS 7,115,977 B2   10/2006   Komiyama et al.
2002/0047213 A1   4/2002   Komiyama et al.
(Continued)

FOREIGN PATENT DOCUMENTS

JP   2002-110898   4/2002
JP   2011-071317   4/2011

OTHER PUBLICATIONS

European Search Report dated Dec. 10, 2012 in corresponding European Patent Application No. 12176963.

*Primary Examiner* — Colleen A Matthews
*Assistant Examiner* — William Harriston
(74) *Attorney, Agent, or Firm* — Young & Thompson

(57) ABSTRACT

A semiconductor device includes a wiring substrate having first and second connection pads on a main surface thereof, a first semiconductor chip having first electrode pads, a second semiconductor chip having second electrode pads each of which has a size smaller than that of each of the first electrode pads, first wires connecting the first electrode pads with the first connection pads, and second wires connecting the second electrode pads with the second connection pads. The second wires have wide width parts at first ends. The first electrode pads are larger than the wide width parts while the second electrode pads are smaller than the wide width parts. The wide width parts are connected the second connection pads and the second wires have second ends connected to the second electrode pads via bump electrodes which are smaller than the second electrode pads.

21 Claims, 5 Drawing Sheets

(51) Int. Cl.
*H01L 25/00* (2006.01)
*H01L 23/31* (2006.01)

(52) U.S. Cl.
CPC .................. *H01L2224/4917* (2013.01); *H01L 2224/73265* (2013.01); *H01L 2224/83101* (2013.01); *H01L 2224/8385* (2013.01); *H01L 2224/85051* (2013.01); *H01L 2224/85181* (2013.01); *H01L 2224/85186* (2013.01); *H01L 2224/85986* (2013.01); *H01L 2224/97* (2013.01); *H01L 2225/0651* (2013.01); *H01L 2924/06* (2013.01); *H01L 2924/15311* (2013.01); *H01L 2924/15798* (2013.01); *H01L 2924/381* (2013.01); *H01L 2924/3862* (2013.01); *H01L 2225/06506* (2013.01); *H01L 2225/06562* (2013.01); *H01L 2225/06572* (2013.01); *H01L 2924/01014* (2013.01); *H01L 2924/01029* (2013.01); *H01L 2924/01015* (2013.01)
USPC ..... 257/786; 257/737; 257/784; 257/E23.068

(56) References Cited

U.S. PATENT DOCUMENTS

| | | |
|---|---|---|
| 2002/0096755 A1 | 7/2002 | Fukui et al. |
| 2002/0153615 A1* | 10/2002 | Komiyama et al. ........... 257/777 |
| 2003/0178710 A1 | 9/2003 | Kang et al. |
| 2005/0200009 A1* | 9/2005 | Kang et al. .................... 257/734 |
| 2007/0295982 A1 | 12/2007 | Ryu et al. |
| 2008/0023831 A1 | 1/2008 | Nishimura et al. |
| 2009/0096111 A1 | 4/2009 | Fujiwara et al. |
| 2011/0074019 A1 | 3/2011 | Yasunaga et al. |

* cited by examiner

SEMICONDUCTOR DEVICE REDUCING RISKS OF A WIRE SHORT-CIRCUIT AND A WIRE FLOW

This application is based upon and claims the benefit of priority from Japanese patent application No. 2011-174576, filed on Aug. 10, 2011, the disclosure of which is incorporated herein in its entirety by reference.

BACKGROUND OF THE INVENTION

1. Field of the Invention

This invention relates to a semiconductor device, and more particularly to a multi-chip package type semiconductor device in which a plurality of semiconductor chips are stacked on a wiring substrate.

2. Description of Related Art

Various multi-chip package type semiconductor devices are already known.

By way of illustration, JP-A 2002-110898 (which will be also called Patent Document 1 and which corresponds to U.S. Pat. No. 7,115,977) discloses a semiconductor device comprising a substrate having a surface on which a wiring pattern is formed; a first semiconductor element (a first semiconductor chip), mounted on the substrate, having first electrode pads; a second semiconductor element (a second semiconductor chip) mounted on the first semiconductor element (the first semiconductor chip), having second electrode pads; first wires connecting a first area of the first electrode pads with the second electrode pads; and second wires connecting a second area of the first electrode pads expect for the first area with the wiring pattern. That is, the semiconductor device disclosed in Patent Document 1 comprises a multi-chip package (MCP) type semiconductor device in which a plurality of semiconductor chips are equipped.

However, the semiconductor device disclosed in Patent Document 1 involves problems as follows.

In recent years, according to demands for reduction in size of potable devices or the like, semiconductor chips in which sizes of chips and sizes of electrode pads are downsized are currently on the market. Therefore, in an MCP type semiconductor device in which a plurality of semiconductor chips are assembled, the plurality of semiconductor chips having different sizes of electrode pads may be mixed in the same package.

In this event, there is a fear that bonding cannot be favorably carried out to smaller electrode pads if wires having large diameters suited to large electrode pads are used. If wires having small diameters suited to small electrode pads are used, the wires become easily deformed on molding, and a wire short-circuit of a wire flow have become increasingly risky.

In addition, JP-A 2011-71317 (which will be also called Patent Document 2 and which corresponds to US 2011/0074019A1) discloses technique for preventing interference between a wide width part of a wire and an insulating film around electrode pads by forming, on the electrode pad, a bump having a width narrower than the wide width part of the wire and by connecting the wide width part of the wire via the bump.

The semiconductor device disclosed in Patent Document 2 involves problems as follows.

Although Patent Document 2 describes configuration so as to arrange the wide width parts of the wires in a staggered manner, Patent Document 2 does not consider the MCP type semiconductor device in which a plurality of semiconductor chips having different sizes of electrode pads are assembled. Accordingly, there is a limit to connect the wide width parts of the wires with the electrode pads which have small pad sizes and which are arranged at a narrow pitch and there still remains the risk of the wire short-circuit due to flow of resin on molding.

SUMMARY

The present invention seeks to solve one or more of the above problems, or to improve upon those problems at least in part.

In one embodiment, there is provided a semiconductor device that includes a wiring substrate, a first semiconductor chip, a second semiconductor chip, a plurality of first wires, and a plurality of second wires. The wiring substrate has, on a main surface thereof, a plurality of first connection pads and a plurality of second connection pads. Mounted over the main surface of the wiring substrate, the first semiconductor chip has a plurality of first electrode pads. Mounted over the main surface of the wiring substrate, the second semiconductor chip has a plurality of second electrode pads which are smaller in size than the plurality of first electrode pads. The plurality of first wires connects the plurality of first electrode pads with the plurality of first connection pads, respectively. The plurality of second wires connects the plurality of second electrode pads with the plurality of second connection pads, respectively, and has wide width parts at first ends thereof. The plurality of first electrode pads are larger than the wide width parts of the plurality of second wires while the plurality of second electrode pads are smaller than the wide width parts of the plurality of second wires. The wide width parts of the plurality of second wires are connected to the plurality of second connection pads, respectively, while second ends of the plurality of second wires are connected to the plurality of second electrode pads, respectively, via a plurality of bump electrodes which is smaller than the plurality of second electrode pads.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Figure 1:
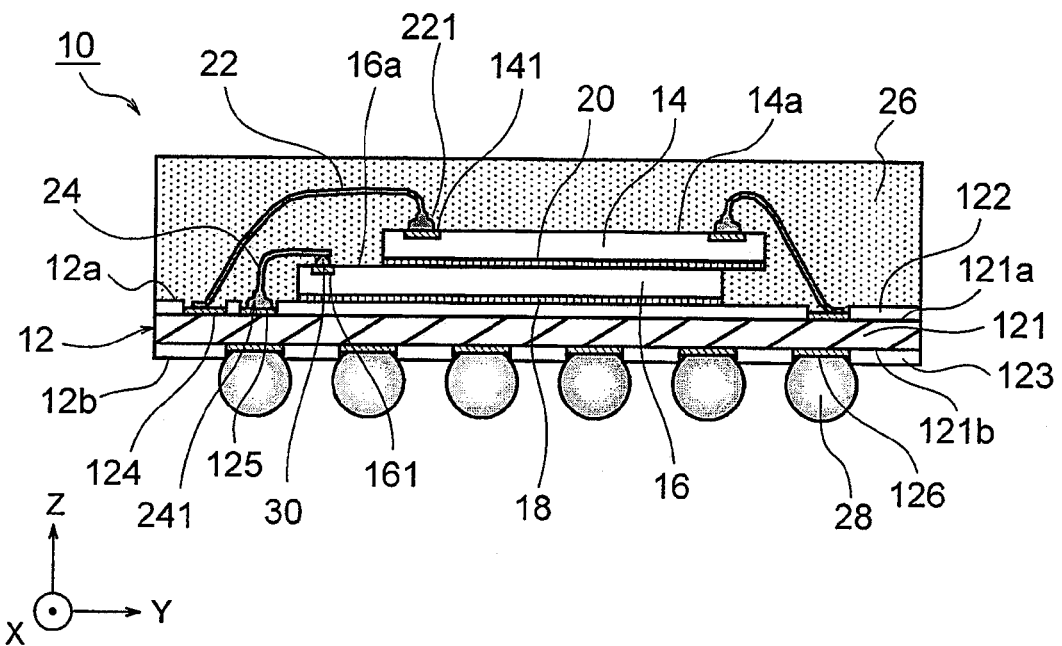
FIG. 1 is a cross-sectional view schematically showing an MCP type semiconductor device according to an exemplary embodiment of this invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A main feature of this invention is as follows.

Specifically, a semiconductor device according to this invention comprises a semiconductor device including: a wiring substrate having a plurality of first connection pads and a plurality of second connection pads which are formed on a main surface thereof; a first semiconductor chip, mounted over the main surface of the wiring substrate, having a plurality of first electrode pads; a second semiconductor chip, mounted over the main surface of the wiring substrate, having a plurality of second electrode pads each having a size smaller than that of each of the plurality of first electrode pads; a plurality of first wires connecting the plurality of first electrode pads with the plurality of first connection pads, respectively; and a plurality of second wires connecting the plurality of second electrode pads with the plurality of second connection pads, respectively, and having wide width parts at first ends thereof, wherein the plurality of first electrode pads are larger than the wide width parts of the plurality of second wires and the plurality of second electrode pads are smaller than the wide width parts of the plurality of second wires, wherein the wide width parts of the plurality of second wires are connected to the plurality of second connection pads, respectively, and second ends of the plurality of second wires are connected to the plurality of second electrode pads, respectively, via a plurality of bump electrodes which is smaller than that of the plurality of second electrode pads.

According to the semiconductor device having such a configuration, it is possible to connect small-diameter electrode pads via bump electrodes with thick wires in an MCP type semiconductor device in which semiconductor chips having different pad sizes are mixed, it is possible to reduce risks of a wire short-circuit and a wire flow, and it is therefore possible to favorably carry out wire connection. As a result, it is possible to improve reliability of the semiconductor device.

In addition, inasmuch as the wide width parts (the first ends) of the second wires are connected to the second connection pads, respectively, while the second ends of the second wires are connected to the second electrode pads, respectively, via small-diameter bump electrodes, it is possible to connect the large-diameter second wires at a narrow pitch to the second electrode pads, respectively, which are smaller than the wide width parts of the second wires and which are arranged at the narrow pitch.

Furthermore, inasmuch as the wide width parts of the second wires are connected to the second connection pads, respectively, it is possible to miniaturize the wiring substrate because it is possible to shorten a length of the second connection pad in a wire stretching direction as compared with that of the first connection pad.

The first semiconductor chip and the second semiconductor chip may be a chip stacked body in which they are stacked on the main surface of the wiring substrate.

The chip stacked body may be one in which the second semiconductor chip is mounted over the main surface of the wiring substrate and the first semiconductor chip is mounted over the second semiconductor chip. In this event, inasmuch as it is possible to shorten a wire length of each of the second wires, it is possible to further reduce occurrence of the wire short-circuit and the wire flow in the second wires which have the small diameter and which are arranged at a narrow pitch.

In addition, the chip stacked body may be one in which the first semiconductor chip is mounted over the main surface of the wiring substrate and the second semiconductor chip is mounted over the first semiconductor chip. In this event, inasmuch as it is possible to lower a wire loop height of the second semiconductor chip serving as an upper semiconductor chip, it is possible to thin a thickness of a sealing resin layer and it is therefore possible to thin a thickness of the semiconductor device.

First Exemplary Embodiment

Figure 2:
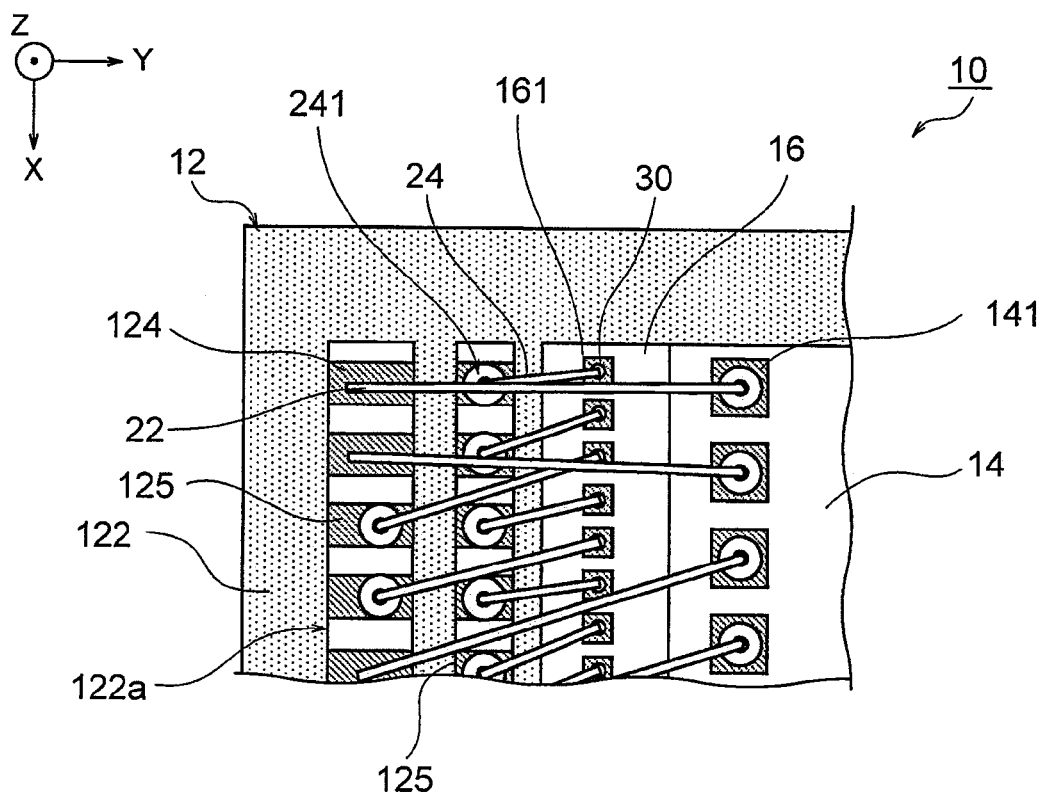
FIG. 2 is a plan view schematically showing a main part of a wire connection portion of the MCP type semiconductor device illustrated in FIG. 1.

Referring now to FIGS. 1 and 2, the description will proceed to an MCP type semiconductor device 10 according to a first exemplary embodiment of this invention. FIG. 1 is a cross-sectional view schematically showing the MCP type semiconductor device 10 and FIG. 2 is a plan view showing a main part of a wire connection portion of the MCP type semiconductor device 10. In the plan view of FIG. 2, a sealing resin (denoted by the reference numeral 26 in FIG. 1) is omitted from the illustration.

Herein, in the manner shown in FIGS. 1 and 2, an orthogonal coordinate system (X, Y, Z) is used. In a state illustrated in FIGS. 1 and 2, in the orthogonal coordinate system (X, Y, Z), an X-axis direction is a fore-and-aft direction (a depth direction), a Y-axis direction is a left-and-right direction (a width direction), and a Z-axis direction is an up-and-down direction (a height direction).

The illustrated semiconductor device 10 comprises a wiring substrate 12, a first semiconductor chip 14, a second semiconductor chip 16, a first adhesive member 18, a second adhesive member 20, a plurality of first wires 22, a plurality of second wires 24, a sealing resin layer 26, and a plurality of solder balls 28.

The wiring substrate 12 is formed of, for example, a glass epoxy substrate substantially in the form of a rectangular plate. The wiring substrate 12 comprises an insulating substrate 121 having an upper surface 121a and a lower surface 121b which are opposed to each other, an upper wiring layer (not shown) and a lower wiring layer (not shown) which are patterned on the upper surface 121a and the lower surface 121b of the insulating substrate 121, respectively, and an upper insulating film 122 and a lower insulating film 123 which are formed so as to cover the upper wiring layer and the lower wiring layer, respectively.

A plurality of first connection pads 124 and a plurality of second connection pads 125 are formed on and connected to the upper wiring layer of the wiring substrate 12 while a plurality of land portions 126 are formed on and connected to the lower wiring layer of the wiring substrate 12. As shown in FIG. 2, the plurality of first connection pads 124 and the plurality of second connection pads 125 are arranged on a main surface (an upper surface) 12a of the wiring substrate 12 near the peripheral portion of the wiring substrate 12.

In the example being illustrated, the plurality of first connection pads 124 are arranged both sides apart from in the left-and-right direction Y each other so as to sandwich the first semiconductor chip 14 and the second semiconductor chip 16 which will later be described and extend in the fore-and-aft direction X. In addition, the plurality of second connection pads 125 are arranged at the left of the second semiconductor chip 16 and extend in the fore-and-aft direction X. But, as apparent from FIG. 2, some of the plurality of second connection pads 125 is also arranged between the plurality of first connection pads 124.

On the other hand, the plurality of land portions 126 are arranged in a grid pattern on a back surface (a lower surface) 12b of the wiring substrate 12. The plurality of first connection pads 124, the plurality of second connection pads 125 and the plurality land portions 126 are connected to each other by wires connected thereto, vias (not shown) extending through the insulating substrate 121, and the like. The plurality of first wires 22 are connected to the plurality of first connection pads 124, respectively, while the plurality of second wires 24 are connected to the plurality of second connection pads 125, respectively. In addition, the respective solder bolls 28 are mounted on the respective land portions 126.

The upper insulating film 122 is formed of, for example, a solder resist (SR). The upper insulating film 122 is formed entirely on the upper surface 121a of the insulating substrate 121 except for predetermined areas. In other words, part of the upper insulating film 122 has been removed from the predetermined areas so that the upper insulating film 122 has a plurality of opening portions 122a. The opening portions 122a expose areas in which the plurality of first connection pads 124 and the plurality of second connection pads 125 are formed and the vicinity thereof.

The lower insulating film 123 is also formed of, for example, a solder resist (SR).

Figure 9:
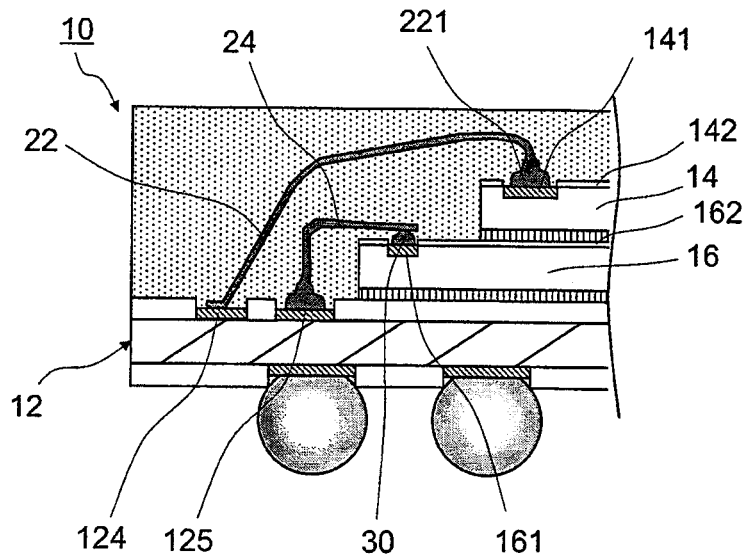
FIG. 9 is a grossly enlarged cross-sectional view schematically showing a main part of the MCP type semiconductor device illustrated in FIG. 1.

The second semiconductor chip 16 is substantially in the form of a rectangular plate. Some circuits and a plurality of second electrode pads 161 are formed on a main surface (an upper surface) 16a of the second semiconductor chip 16. The plurality of second electrode pads 161 are arranged along one side (in the example being illustrated, a left side) of the second semiconductor chip 16. The second semiconductor chip 16 includes an insulating film formed on the main surface to expose the first electrode pads 161 from the insulating film 162 in FIG. 9. An opening formed in the insulating film 162 to expose the first electrode pad 161 is smaller in width than wide width parts 221.

The second semiconductor chip 16 is mounted over the main surface 12a of the wiring substrate 12 near the center of the wiring substrate 12 and located at a position deviated leftward from the center of the wiring substrate 12 in FIG. 1. The second semiconductor chip 16 is mounted via the first adhesive layer 18 over the main surface (the upper surface) 12a of the wiring substrate 12. The first adhesive layer 18 is made of, for example, a die-attached film (DAF).

The first semiconductor chip 14 is substantially in the form of a rectangular plate as with the second semiconductor chip 16. Some circuits and a plurality of first electrode pads 141 are formed on a main surface (an upper surface) 14a of the first semiconductor chip 14. The plurality of first electrode pads 141 are arranged along both sides of the first semiconductor chip 14 that are opposite to each other in the left-and-right direction Y. The first semiconductor chip 14 includes an insulating film formed on the main surface to expose the first electrode pads 141 from the insulating film 142 in FIG. 9.

The first semiconductor chip 14 is stacked and mounted over the second semiconductor chip 16 such that the corresponding sides of the first semiconductor chip 14 and the second semiconductor chip 16 are in parallel to each other.

The first semiconductor chip 14 is deviated rightward from the second semiconductor chip 16 so as to not cover an area of the second semiconductor chip 16 in which the plurality of second electrode pads 161 are formed. As a result, part of the first semiconductor chip 14 projects outward from the second semiconductor chip 16. The first semiconductor chip 14 is mounted via the second adhesive member 20 over the main surface (the upper surface) 16a of the second semiconductor chip 16. The second adhesive member 20 is made of, for example, a die-attached film (DAF).

In the manner as apparent from FIG. 2, each of the plurality of second electrode pads 161 of the second semiconductor chip 16 has a width which is smaller than of each of the plurality of first electrode pads 141 of the first semiconductor chip 14. In other words, each of the plurality of second electrode pads 161 of the second semiconductor chip 16 has an area which is smaller than that of each of the plurality of first electrode pads 141 of the first semiconductor chip 14. In addition, the plurality of second electrode pads 161 are arranged at a pitch which is narrower than that of the plurality of first electrode pads 141.

The second semiconductor chip 16 is also called a lower semiconductor chip while the first semiconductor chip 14 is also called an upper semiconductor chip. In addition, inasmuch as the first semiconductor chip 14 and the second semiconductor chip 16 are stacked in the first exemplary embodiment, those semiconductor chips 14 and 16 are collectively called a chip stacked body.

In the manner which is described above, the lower semiconductor chip (the second semiconductor chip) 16 is mounted over the main surface 12a of the wiring substrate 12 via the first adhesive member 18 and the upper semiconductor chip (the first semiconductor chip) 14 is mounted over the lower semiconductor chip 16 via the second adhesive member 20. The first and the second semiconductor chips 14 and 16 have the plurality of first electrode pads 141 and the plurality of second electrode pads 161, respectively, formed thereon. In the first exemplary embodiment, the electrode pad (the second electrode pad) 161 of the lower semiconductor chip 16 has the width which is smaller than that of the electrode pad (the first electrode pad) 141 of the upper semiconductor chip 14. In addition, the lower semiconductor chip 16 has the plurality of second electrode pads 161 which are arranged along, for example, one side thereof at the narrow pitch. The first semiconductor chip 14 is stacked on the second semiconductor chip 16 with the first semiconductor chip deviated so as to expose the plurality of second electrode pads 161.

Each of the plurality of first and second wires 22 and 24 is made of a conductive metal such as Au, Cu, or the like. The plurality of first wires 22 electrically connect between the plurality of first electrode pads 141 and the plurality of first connection pads 124. The plurality of second wires 24 electrically connect between the plurality of second electrode pads 161 and the plurality of second connection pads 125.

More specifically, each of the plurality of first wires 22 has a wide width part 221 at a first end thereof while each of the plurality of second wires 24 has a wide width part 241 at a first end thereof. The first electrode pad 141 is larger than the wide width part 241 of the second wire 24 while the second electrode pad 161 is smaller than the wide width part 241 of the second wire 24. The wide width part 241 of the second wire 24 is connected to the corresponding second connection pad 125 and a second end of the second wire 24 is connected to the corresponding second electrode pad 161 via a bump electrode 30 which is smaller than the second electrode pad 161. The small bump electrode 30 comprises a wire bump which is made of, for example, Au, Cu, or the like. Accordingly, it is possible to form the small bump electrode 30 by forming a wire bump made of a wire having a diameter which is narrower than that of the second wire 24.

The sealing resin layer 26 is made of an insulating resin and is formed at a side of the main surface (the upper surface) 12*a* of the wiring substrate 12. That is, the sealing resin layer 26 covers almost the entire surface of the first and the second semiconductor chips 14 and 16, and the plurality of first and second wires 22 and 24.

In the manner which is described above, the semiconductor device 10 according to the first exemplary embodiment comprises a semiconductor device having structure in which two semiconductor chips 14 and 16 are deviated and stacked in terms of the efficiency of a wire bonding process.

In other words, the semiconductor device (10) according to the first exemplary embodiment comprises a semiconductor device including: the wiring substrate (12) having the plurality of first connection pads (124) and the plurality of second connection pads (125) which are formed on the main surface (12*a*) thereof; the first semiconductor chip (14), mounted over the main surface (12*a*) of the wiring substrate (12), having the plurality of first electrode pads (141); the second semiconductor chip (16), mounted over the main surface (12*a*) of the wiring substrate (12), having the plurality of second electrode pads (161) each having a size smaller than that of each of the plurality of first electrode pads; the plurality of first wires (22) connecting the plurality of first electrode pads (141) with the plurality of first connection pads (124), respectively; and the plurality of second wires (24) connecting the plurality of second electrode pads (161) with the plurality of second connection pads (125), respectively, and having wide width parts (241) at first ends thereof, wherein the plurality of first electrode pads (141) are larger than the wide width parts (241) of the plurality of second wires (24) and the plurality of second electrode pads (161) are smaller than the wide width parts (241) of the plurality of second wires (24), wherein the wide width parts (241) of the plurality of second wires (24) are connected to the plurality of second pads (125), respectively, and second ends of the plurality of second wires (24) are connected to the plurality of second electrode pads (161), respectively, via the plurality of bump electrodes (30) which are smaller than the plurality of second electrode pads (161).

And then, in the semiconductor device (10) according to the first exemplary embodiment, the first semiconductor chip (14) and the second semiconductor chip (16) are stacked over the main surface (12*a*) of the wiring substrate (12). The second semiconductor chip (16) is mounted over the main surface (12*a*) of the wiring substrate (12) while the first semiconductor chip (14) is mounted over the second semiconductor chip (16). The first semiconductor chip (14) is stacked on the second semiconductor chip (16) with the first semiconductor chip (14) deviated from the second semiconductor chip (16) so as to expose the plurality of second electrode pads (161).

Now, the description will proceed to effects of the semiconductor device 10 according to the first exemplary embodiment.

First, it is possible to improve reliability of the semiconductor device 10. This is because it is possible to connect the second electrode pad 161 having the small diameter with the thick second wire 24 via the bump electrode 30 in the MCP type semiconductor device in which the semiconductor chips 14 and 16 having the different pad sizes are mixed, it is possible to reduce the risks of the wire short-circuit and the wire flow, and it is possible to favorably carry out the wire connection.

Secondly, it is possible to connect the second wires 24 having the large diameter at the narrow pitch to the second electrode pads 161 which have the width smaller than the wide width parts 241 of the second wires 24 and which are arranged at the narrow pitch. This is because the wide width parts 241 (the first ends) are connected to the second connection pads 125 and the second ends are connected to the second electrode pads 161 via the bump electrodes 30 having the small diameter.

Thirdly, it is possible to shrink the wiring substrate 12. This is because it is possible to configure so as to shorten a length of the second connection pad 125 in a wire stretching direction as compared with the first connection pad 124 by connecting the wide width part 241 of the second wire 24 to the second connection pad 125.

Fourthly, it is possible to further reduce the occurrence of the wire short-circuit and the wire flow in the second wires 24 which have the small diameter and which are arranged at the narrow pitch. This is because it is possible to shorten a wire length of the second wire 24 so that the second semiconductor chip 16 is mounted on the main surface 12*a* of the wiring substrate 12 and the first semiconductor chip 14 is mounted on the second semiconductor chip 16.

FIGS. 3A through 3E are cross-sectional views collectively showing an assembly flow of the semiconductor device 10.

Figure 3:
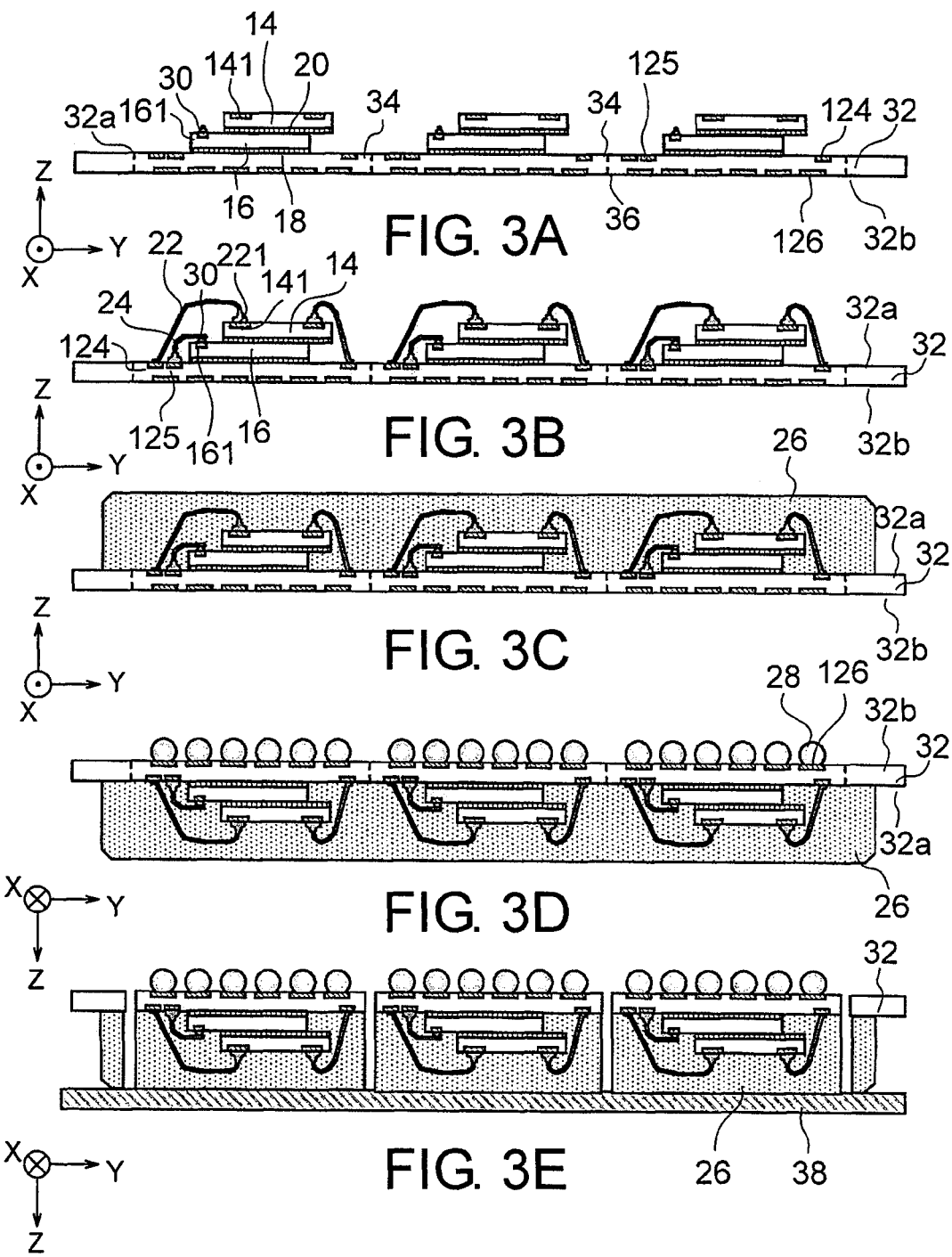
FIGS. 3A-3E are cross-sectional views collectively showing an assembly flow of the MCP type semiconductor device illustrated in FIGS. 1 and 2.

Referring to FIG. 3A, a wiring motherboard 32 includes a plurality of product formation portions 34 in an area surrounded by a frame portion (not shown), which has positioning holes (not shown) formed therein. The product formation portions 34 are arranged like a matrix. In each of the product formation portions 34, the plurality of first connection pads 124 and the plurality of second connection pads 125 are formed on a main surface (an upper surface) 32*a* of the wiring motherboard 32 while the plurality of land portions 126 are formed on a back surface (a lower surface) 32*b* of the wiring motherboard 32. Those product formation portions 34 are later individually cut along dicing lines 36 to thereby produce a plurality of wiring substrates 12.

Subsequently, as shown in FIG. 3A, a plurality of second semiconductor chips 16 and a plurality of first semiconductor chips 14 are sequentially mounted over the main surface (the upper surface) 32*a* of the wiring motherboard 32. Each second semiconductor chip 16 is bonded and fixed to the main surface 32*a* of the wiring motherboard 32 by means of the first adhesive member 18 provided on the back surface (the lower surface) thereof. Each first semiconductor chip 14 is bonded and fixed to the main surface of the second semiconductor chip 16 by means of the second adhesive member 20 provided on the back surface (the lower surface) thereof. In this event, the first semiconductor chip 14 is stacked on the second semiconductor chip 16 so as to expose the plurality of second electrode pads 161 of the second semiconductor chip 16.

Subsequently, as shown in FIG. 3A, the bump electrodes (the wire bumps) 30 are formed on the plurality of second electrode pads 161, respectively.

Now, the description will proceed to the formation of the wire bump 30. The wire bump 30 is made of, for example, Au, Cu, or the like. The wire bump 30 is formed, by means of a wire bonding apparatus (not shown), by connecting a wire having a molten ball at a tip thereof to the second electrode pad 161 of the second semiconductor chip 16 by ultrasound thermocompression bonding, and by tearing a rear end of the wire off. In the first exemplary embodiment, it is possible to form the wire bump 30 having the small diameter by using the wire having a diameter which is smaller than that of the first and the second wires 22 and 24.

Herein, the description will proceed to examples of concrete dimensions, namely, sizes (widths) of the first electrode pad 141 and the second electrode pad 161, diameters of the first and the second wires 22 and 24, diameters of wide width parts 221 and 241, a diameter of the bump electrode (the wire bump) 30, and a diameter of the small-diameter wire for use in forming the wire bump 30. The first electrode pad 141 has the size (the width) of 80 μm. The second electrode pad 161 has the size (the width) of 40 μm. Each of the first and the second wires 22 and 24 has the diameter of 27 μm. Each of the wide width parts 221 and 241 has the diameter of 60 μm. The bump electrode (the wire bump) 30 has the diameter of 35 μm. The small-diameter wire has the diameter of 15 μm.

Next, as shown in FIG. 3B, the plurality of second electrode pads 161 of the second semiconductor chip 16 and the corresponding plurality of second connection pads 125 are connected to each other by the plurality of second wires 24. In this event, the wide width parts 241 (the first ends) of the second wires 24 are connected to the second connection pads 125, respectively, while the second ends of the second wires 24 are connected to the second electrode pads 161, respectively, via the wire bumps (the bump electrodes) 30. Subsequently, as shown in FIG. 3B, the plurality of first electrode pads 141 of the first semiconductor chip 14 and the corresponding plurality of first connection pads 124 are connected to each other by the plurality of first wires 22. In this event, the wide width parts 221 (the first ends) of the first wires 22 are connected to the first electrode pads 141 while the second ends of the first wires 22 are connected to the first connection pads 124.

Then, as shown in FIG. 3C, the sealing resin layer 26 is formed on the main surface (the upper surface) 32a of the wiring motherboard 32 by bulk molding.

Subsequently, as shown in FIG. 3D, the wiring motherboard 32 is tuned upside down, and the plurality of solder balls 28 are mounted onto the respective plurality of land portions 126 on the back surface (the lower surface) 32b of the wiring motherboard 32. The solder balls 28 are used as external terminals of the semiconductor device 10.

The plurality of solder balls 28 are mounted with, for example, a suction mechanism (not shown) having a plurality of suction holes arranged so as to correspond to the plurality of land portions 126. In this event, the plurality of solder balls 28 are attracted and held by the suction mechanism, a flux is transferred to the solder balls 28 being held. The plurality of solder balls 28 are collectively mounted on the plurality of land portions 126 of the wiring motherboard 32. Then, the plurality of solder balls 28 and the plurality of land portions 126 are connected and fixed to each other by a reflow process.

Subsequently, as shown in FIG. 3E, the sealing resin layer 26 is bonded to a dicing tape 38. Thus, the sealing resin layer 26 and the wiring motherboard 32 are supported by the dicing tape 38. Thereafter, the wiring motherboard 32 and the sealing resin layer 26 are cut lengthwise and breadthwise along the dicing lines (see, FIG. 3A) by means of a dicing blade (not shown). As a result, the wiring motherboard 32 is divided into individual product formation portions 34. The semiconductor device 10 as shown in FIG. 1 is obtained by picking up one of the divided product formation portions 34 and the sealing resin layers 26 from the dicing tape 38.

Although the description is made as regards in a case where the wire bumps 30 are formed after stacking the chips in the manufacturing method of the above-mentioned semiconductor device 10, the semiconductor chip 16 with wire bumps may be formed by forming the wire bumps 30 in a state of a wafer, and by cutting each chip.

First Modified Example

Figure 4:
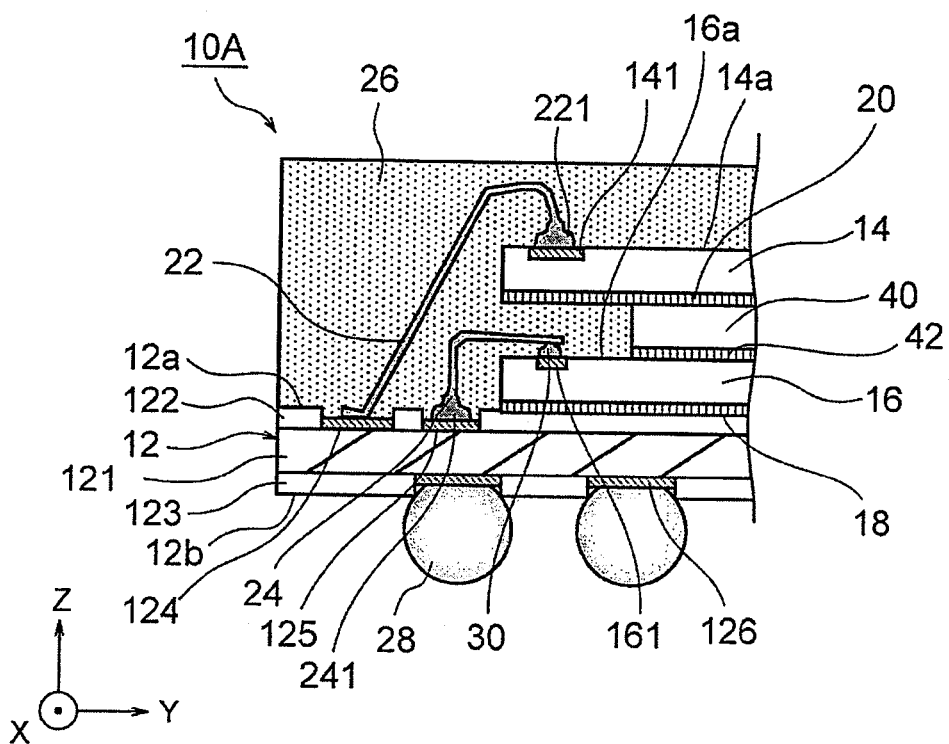
FIG. 4 is a cross-sectional view schematically showing a main part of an MCP type semiconductor device according to a first modified example of the first exemplary embodiment of this invention.

Referring to FIG. 4, the description will proceed to an MCP type semiconductor device 10A according to a first modified example of the first exemplary embodiment of this invention. FIG. 4 is a cross-sectional view showing a main portion of the MCP type semiconductor device 10A. In the first modified example, the same elements as in the MCP type semiconductor device 10 illustrated in FIGS. 1 and 2 are denoted by the same reference numerals, and the description will be made as regards only differences for the sake of simplification of the description.

The illustrated semiconductor device 10A is similar in structure to the semiconductor device 10 according to the first exemplary embodiment except that a spacer 40 comprising a silicon substrate and a third adhesive member 42 are inserted between the first semiconductor chip 14 and the second semiconductor chip 16. In addition, the first semiconductor chip 14 and the second semiconductor chip 16 are stacked to each other without displacing positions thereof.

That is, the illustrated semiconductor device 10A comprises a semiconductor device in which a plurality of semiconductor chips 14 and 16 having different pad sizes are stacked via the spacer 40 comprising the silicon substrate.

The semiconductor device 10A according to the first modified example also has effects which are similar to those of the semiconductor device 10 according to the above-mentioned first exemplary embodiment.

Second Modified Example

Figure 5:
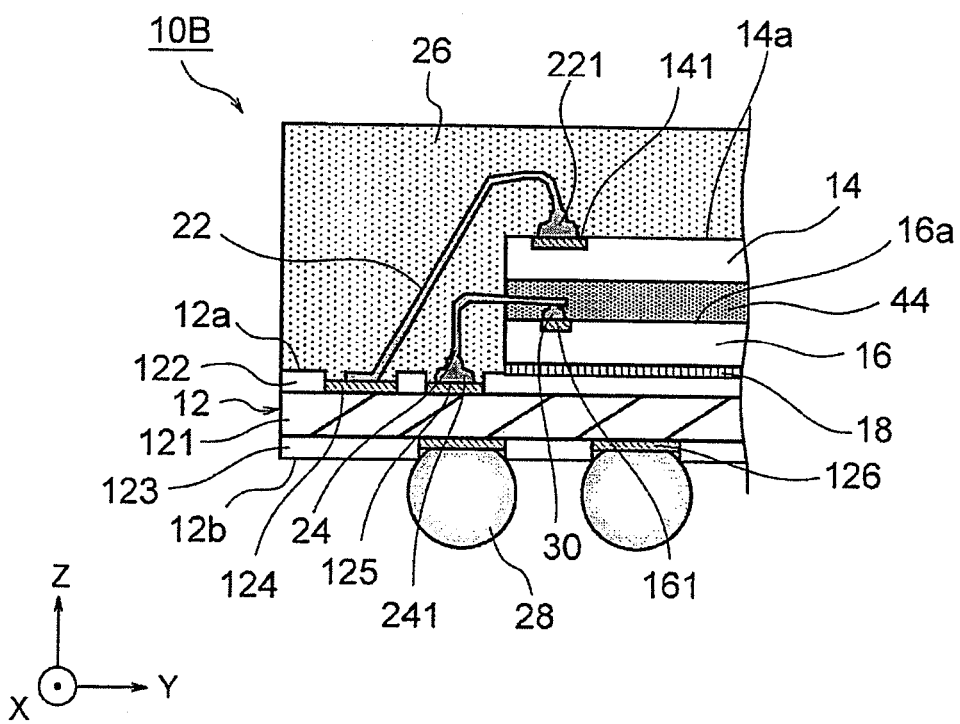
FIG. 5 is a cross-sectional view schematically showing a main part of an MCP type semiconductor device according to a second modified example of the first exemplary embodiment of this invention.

Referring to FIG. 5, the description will proceed to an MCP type semiconductor device 10B according to a second modified example of the first exemplary embodiment of this invention. FIG. 5 is a cross-sectional view showing a main portion of the MCP type semiconductor device 10B. In the second modified example, the same elements as in the MCP type semiconductor device 10 illustrated in FIGS. 1 and 2 are denoted by the same reference numerals, and the description will be made as regards only differences for the sake of simplification of the description.

The illustrated semiconductor device 10B is similar in structure to the semiconductor device 10 according to the first exemplary embodiment except that an adhesive member 44 enable to embed and bond wires are inserted between the first semiconductor chip 14 and the second semiconductor chip 16. As such an adhesive member 44, for example, a film on wire (FOW) may be used. In addition, the first semiconductor chip 14 and the second semiconductor chip 16 are stacked to each other without displacing positions thereof.

That is, the illustrated semiconductor device 10B comprises a semiconductor device in which a plurality of semiconductor chips 14 and 16 having different pad sizes are mounted using the adhesive member (e.g. the film on wire (FOW)) enable to embed and bond the wires.

The semiconductor device 10B according to the second modified example also has effects which are similar to those of the semiconductor device 10 according to the above-mentioned first exemplary embodiment.

Second Exemplary Embodiment

Figure 6:
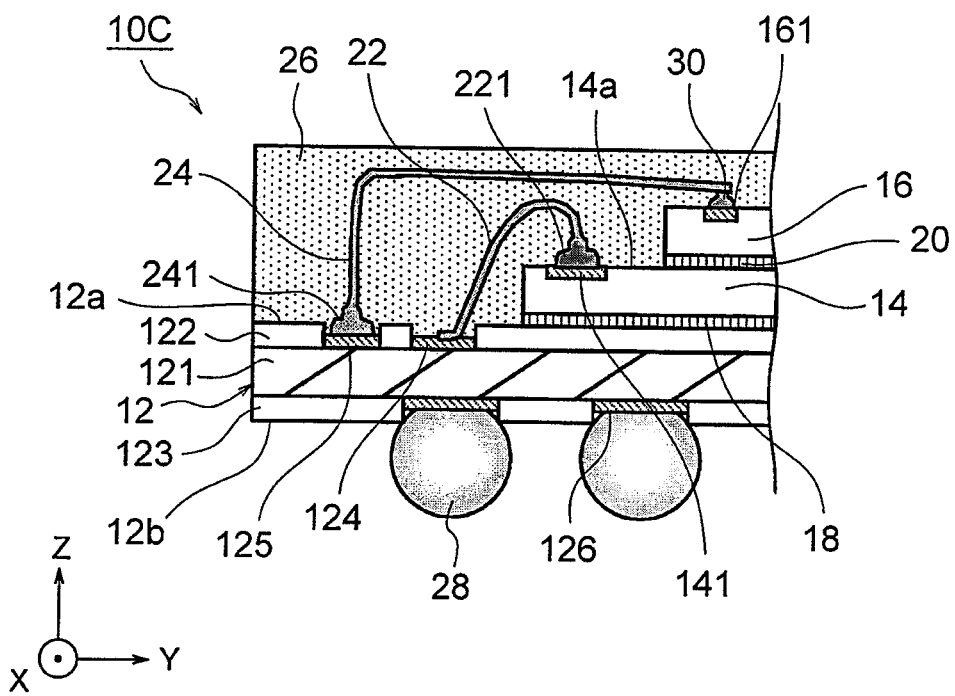
FIG. 6 is a cross-sectional view schematically showing a main part of an MCP type semiconductor device according to a second exemplary embodiment of this invention.

Referring to FIG. 6, the description will proceed to an MCP type semiconductor device 10C according to a second exemplary embodiment of this invention. FIG. 6 is a cross-sectional view showing a main portion of the MCP type semiconductor device 10C. In the second exemplary embodiment, the same elements as in the MCP type semiconductor device 10 illustrated in FIGS. 1 and 2 are denoted by the same reference numerals, and the description will be made as regards only differences for the sake of simplification of the description.

The illustrated semiconductor device 10C is similar in structure to the semiconductor device 10 according to the first exemplary embodiment except that a stacked relationship of the chip stacked body comprising the first semiconductor chip 14 and the second semiconductor chip 16 is different to each other.

More specifically, in the semiconductor device 10C according to the second exemplary embodiment, the first semiconductor chip 14 is mounted over the main surface 12a of the wiring substrate 12 near the center of the wiring substrate 12 and located at a position deviated leftward from the center of the wiring substrate 12 in FIG. 6. The first semiconductor chip 14 is mounted via the first adhesive layer 18 made of, for example, a die-attach film (DAF) over the main surface (the upper surface) 12a of the wiring substrate 12.

The second semiconductor chip 16 is stacked and mounted over the first semiconductor chip 14 such that the corresponding sides of the second semiconductor chip 16 and the first semiconductor chip 14 are in parallel to each other. The second semiconductor chip 16 is deviated rightward from the first semiconductor chip 14 so as to not cover an area of the first semiconductor chip 14 in which the plurality of first electrode pads 141 are formed. As a result, part of the second semiconductor chip 16 projects outward from the first semiconductor chip 14. The second semiconductor chip 14 is mounted via the second adhesive member 20 made of, for example, a die-attached film (DAF) over the main surface (the upper surface) 14a of the first semiconductor chip 14.

In other words, the semiconductor device (10C) according to the second exemplary embodiment comprises a semiconductor device including: the wiring substrate (12) having the plurality of first connection pads (124) and the plurality of second connection pads (125) which are formed on the main surface (12a) thereof; the first semiconductor chip (14), mounted over the main surface (12a) of the wiring substrate (12), having the plurality of first electrode pads (141); the second semiconductor chip (16), mounted over the main surface (12a) of the wiring substrate (12), having the plurality of second electrode pads (161) each having a size smaller than that of each of the plurality of first electrode pads; the plurality of first wires (22) connecting the plurality of first electrode pads (141) with the plurality of first connection pads (124), respectively; and the plurality of second wires (24) connecting the plurality of second electrode pads (161) with the plurality of second connection pads (125), respectively, and having wide width parts (241) at first ends thereof, wherein the plurality of first electrode pads (141) are larger than the wide width parts (241) of the plurality of second wires (24) and the plurality of second electrode pads (161) are smaller than the wide width parts (241) of the plurality of second wires (24), wherein the wide width parts (241) of the plurality of second wires (24) are connected to the plurality of second pads (125), respectively, and second ends of the plurality of second wires (24) are connected to the plurality of second electrode pads (161), respectively, via the plurality of bump electrodes (30) which are smaller than the plurality of second electrode pads (161).

And then, in the semiconductor device (10C) according to the second exemplary embodiment, the first semiconductor chip (14) and the second semiconductor chip (16) are stacked on the main surface (12a) of the wiring substrate (12). The first semiconductor chip (14) is mounted over the main surface (12a) of the wiring substrate (12) while the second semiconductor chip (16) is mounted over the first semiconductor chip (14). The second semiconductor chip (16) is stacked on the first semiconductor chip (14) with the second semiconductor chip (16) deviated from the first semiconductor chip (14) so as to expose the plurality of first electrode pads (141).

Now, the description will proceed to effects of the semiconductor device 10C according to the second exemplary embodiment.

First, it is possible to improve reliability of the semiconductor device 10C. This is because it is possible to connect the second electrode pad 161 having the small diameter with the thick second wire 24 via the bump electrode 30 in the MCP type semiconductor device in which the semiconductor chips 14 and 16 having the different pad sizes are mixed, it is possible to reduce the risks of the wire short-circuit and the wire flow, and it is possible to favorably carry out the wire connection.

Secondly, it is possible to connect the second wires 24 having the large diameter at the narrow pitch to the second electrode pads 161 which have the width smaller than the wide width parts 241 of the second wires 24 and which are arranged at the narrow pitch. This is because the wide width parts 241 (the first ends) are connected to the second connection pads 125 and the second ends are connected to the second electrode pads 161 via the bump electrodes 30 having the small diameter.

Thirdly, it is possible to reduce thickness of the semiconductor chip 10C. This is because it is possible to lower a wire loop height in the upper semiconductor chip 16 and to thin a thickness of the sealing resin layer 26 formed on the wiring substrate 12 so that the first semiconductor chip 14 is mounted over the main surface 12a of the wiring substrate 12 and the second semiconductor chip 16 having the small second electrode pads 161 is mounted over the first semiconductor chip 14.

Third Exemplary Embodiment

Figure 7:
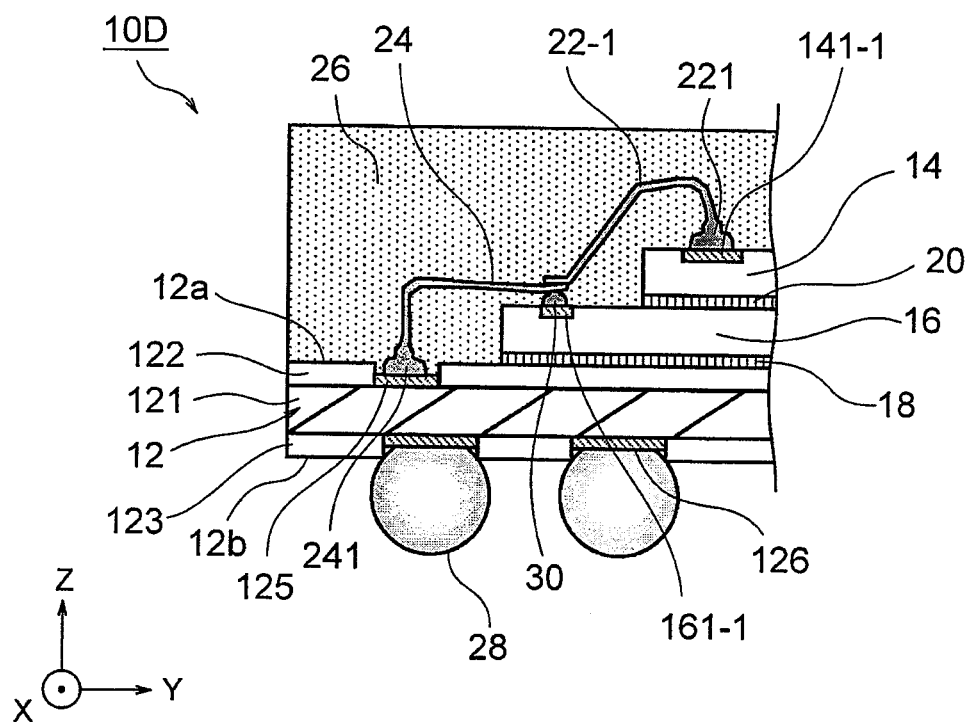
FIG. 7 is a cross-sectional view schematically showing a main part of an MCP type semiconductor device according to a third exemplary embodiment of this invention.

Referring to FIG. 7, the description will proceed to an MCP type semiconductor device 10D according to a third exemplary embodiment of this invention. FIG. 7 is a cross-sectional view showing a main portion of the MCP type semiconductor device 10D. In the third exemplary embodiment, the same elements as in the MCP type semiconductor device 10 illustrated in FIGS. 1 and 2 are denoted by the same reference numerals, and the description will be made as regards only differences for the sake of simplification of the description.

The illustrated semiconductor device 10D is similar in structure to the semiconductor device 10 according to the first exemplary embodiment but there is difference therebetween with respect to configuration for connecting, on the second electrode pad 161, common pins such as electrode pads having the same potential in the first semiconductor chip 14 and the second semiconductor chip 16.

More specifically, in the semiconductor device 10D according to the third exemplary embodiment, it is assumed that a specific first electrode pad 141-1 among the plurality of first electrode pads 141 and a specific second electrode pad 161-1 among the plurality of second electrode pads 161 have the same potential. In this event, a specific first wire 22-1 among the plurality of first wires 22 connects the specific first electrode pad 141-1 with the specific second electrode pad 161-1.

In other words, the semiconductor device (10D) according to the third exemplary embodiment comprises a semiconductor device including: the wiring substrate (12) having the plurality of first connection pads (124) and the plurality of second connection pads (125) which are formed on the main surface (12a) thereof; the first semiconductor chip (14), mounted over the main surface (12a) of the wiring substrate (12), having the plurality of first electrode pads (141); the second semiconductor chip (16), mounted over the main surface (12a) of the wiring substrate (12), having the plurality of second electrode pads (161) each having a size smaller than that of each of the plurality of first electrode pads; the plurality of first wires (22) connecting the plurality of first electrode pads (141) with the plurality of first connection pads (124), respectively; and the plurality of second wires (24) connecting the plurality of second electrode pads (161) with the plurality of second connection pads (125), respectively, and having wide width parts (241) at first ends thereof, wherein the plurality of first electrode pads (141) are larger than the wide width parts (241) of the plurality of second wires (24) and the plurality of second electrode pads (161) are smaller than the wide width parts (241) of the plurality of second wires (24), wherein the wide width parts (241) of the plurality of second wires (24) are connected to the plurality of second pads (125), respectively, and second ends of the plurality of second wires (24) are connected to the plurality of second electrode pads (161), respectively, via the plurality of bump electrodes (30) which are smaller than the plurality of second electrode pads (161).

And then, in the semiconductor device (10D) according to the third exemplary embodiment, the first semiconductor chip (14) and the second semiconductor chip (16) are stacked on the main surface (12a) of the wiring substrate (12). The second semiconductor chip (16) is mounted over the main surface (12a) of the wiring substrate (12) while the first semiconductor chip (14) is mounted over the second semiconductor chip (16). The first semiconductor chip (14) is stacked on the second semiconductor chip (16) with the first semiconductor chip (14) deviated from the second semiconductor chip (16) so as to expose the plurality of second electrode pads (161). In a case where the specific first electrode pad (141-1) among the plurality of first electrode pads (141) and the specific second electrode pad (161-1) among the plurality of second electrode pads (161) have the same potential, the specific first wire (22-1) among the plurality of first wires (22) connects the specific first electrode pad (141-1) with the specific second electrode pad (161-1).

The semiconductor device 10D according to the third exemplary embodiment has also effects which are similar to those of the semiconductor device 10 according to the above-mentioned first exemplary embodiment. Furthermore, it is possible to simplify wiring of the connection pads 124 and 125 on the wiring substrate 12 by connecting the common pins of the first semiconductor chip 14 and the second semiconductor chip 16. In addition, it is possible to miniaturize the wiring substrate 12 because it is possible to shorten lengths of the connection pads 124 and 125 on the wiring substrate 12 in the wire stretching direction.

Fourth Exemplary Embodiment

Figure 8:
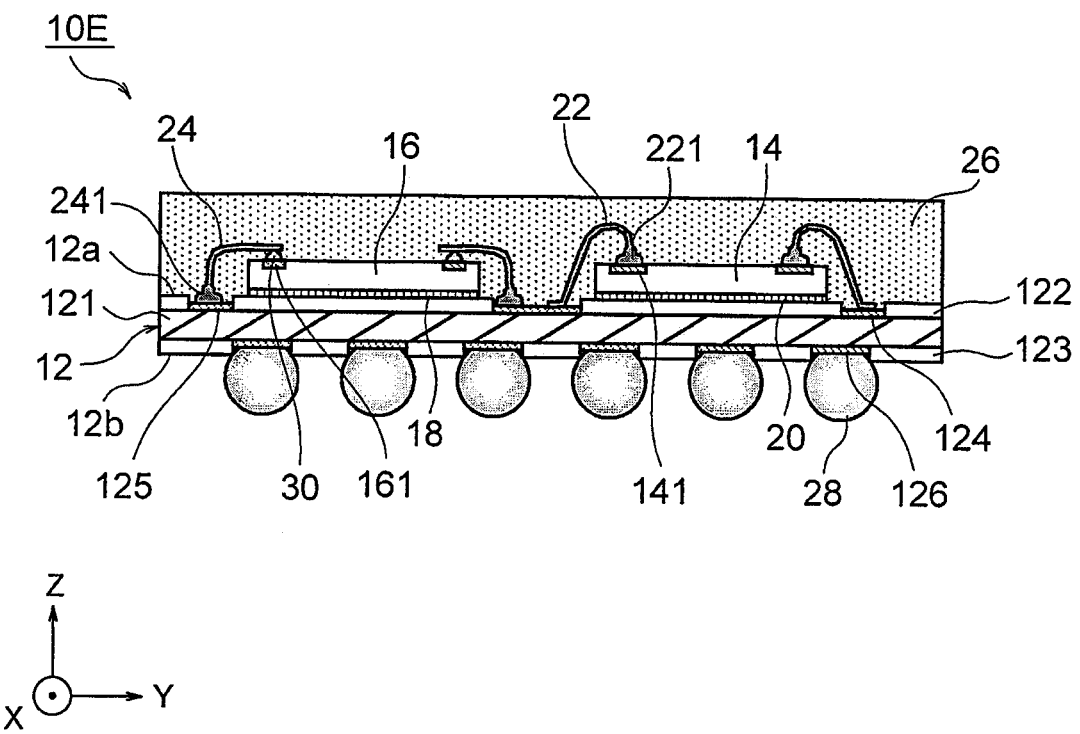
FIG. 8 is a cross-sectional view schematically showing a main part of an MCP type semiconductor device according to a fourth exemplary embodiment of this invention.

Referring to FIG. 8, the description will proceed to an MCP type semiconductor device 10E according to a fourth exemplary embodiment of this invention. FIG. 8 is a cross-sectional view showing a main portion of the MCP type semiconductor device 10E. In the fourth exemplary embodiment, the same elements as in the MCP type semiconductor device 10 illustrated in FIGS. 1 and 2 are denoted by the same reference numerals, and the description will be made as regards only differences for the sake of simplification of the description.

The illustrated semiconductor device 10E is similar in structure to the semiconductor device 10 according to the first exemplary embodiment except that the first semiconductor chip 14 and the second semiconductor chip 16 are put on the main surface 12a of the wiring substrate 12 side by side.

That is, the illustrated semiconductor device 10E comprises a semiconductor device in which the semiconductor chips 14 and 16 having the different pad sizes are put on the main surface 12a of the wiring substrate 12 side by side.

In other words, the semiconductor device (10E) according to the fourth exemplary embodiment comprises a semiconductor device including: the wiring substrate (12) having the plurality of first connection pads (124) and the plurality of second connection pads (125) which are formed on the main surface (12a) thereof; the first semiconductor chip (14), mounted over the main surface (12a) of the wiring substrate (12), having the plurality of first electrode pads (141); the second semiconductor chip (16), mounted over the main surface (12a) of the wiring substrate (12), having the plurality of second electrode pads (161) each having a size smaller than that of each of the plurality of first electrode pads; the plurality of first wires (22) connecting the plurality of first electrode pads (141) with the plurality of first connection pads (124), respectively; and the plurality of second wires (24) connecting the plurality of second electrode pads (161) with the plurality of second connection pads (125), respectively, and having wide width parts (241) at first ends thereof, wherein the plurality of first electrode pads (141) are larger than the wide width parts (241) of the plurality of second wires (24) and the plurality of second electrode pads (161) are smaller than the wide width parts (241) of the plurality of second wires (24), wherein the wide width parts (241) of the plurality of second wires (24) are connected to the plurality of second pads (125), respectively, and second ends of the plurality of second wires (24) are connected to the plurality of second electrode pads (161), respectively, via the plurality of bump electrodes (30) which are smaller than the plurality of second electrode pads (161).

And then, in the semiconductor device (10E) according to the fourth exemplary embodiment, the first semiconductor chip (14) and the second semiconductor chip (16) are put on the main surface (12a) of the wiring substrate (12) side by side.

Now, the description will proceed to effects of the semiconductor device 10E according to the fourth exemplary embodiment.

First, it is possible to improve reliability of the semiconductor device 10E. This is because it is possible to connect the second electrode pad 161 having the small diameter with the thick second wire 24 via the bump electrode 30 in the MCP type semiconductor device in which the semiconductor chips 14 and 16 having the different pad sizes are mixed, it is possible to reduce the risks of the wire short-circuit and the wire flow, and it is possible to favorably carry out the wire connection.

Secondly, it is possible to connect the second wires 24 having the large diameter at the narrow pitch to the second electrode pads 161 which have the width smaller than the wide width parts 241 of the second wires 24 and which are arranged at the narrow pitch. This is because the wide width parts 241 (the first ends) are connected to the second connection pads 125 and the second ends are connected to the second electrode pads 161 via the bump electrodes 30 having the small diameter.

Thirdly, it is possible to further reduce the occurrence of the wire short-circuit and the wire flowing in the second wires 24 which have the small diameter and which are arranged at the narrow pitch. This is because it is possible to shorten a wire length of the second wire 24 so that the second semiconductor chip 16 is mounted on the main surface 12a of the wiring substrate 12.

Fourthly, it is possible to reduce thickness of the semiconductor chip 10E. This is because it is possible to lower a wire loop height in the semiconductor chips 14 and 16 and to thin a thickness of the sealing resin layer 26 formed on the wiring substrate 12 so that the first semiconductor chip 14 and the second semiconductor chip 16 are put on the main surface 12a of the wiring substrate 12 side by side.

It is apparent that the present invention is not limited to the above embodiments, but may be modified and changed without departing from the scope and spirit of the invention.

For example, although the description has been made as regards the semiconductor device in which two semiconductor chips having different pad sizes are mounted over the main surface of the wiring substrate in the above-mentioned exemplary embodiments, the present invention may be applied to a semiconductor device in which three or more semiconductor chips including two semiconductor chips having different pad sizes are mounted over the main surface of the wiring substrate.

In addition, although the description has been made as regards the semiconductor device including the wiring substrate made of a glass epoxy substrate in the above-mentioned exemplary embodiments, the present invention may be applied to a semiconductor device including a flexible wiring substrate made of a polyimide substrate.

The technical ides of the semiconductor device of this invention can be applicable to various semiconductor devices. For example, this invention can be applicable to the semiconductor products in general such as a CPU (Central Processing Unit), an MCU (Micro Control Unit), a DSP (Digital Signal Processor), an ASIC (Application Specific Integrated Circuit), an ASSP (Application Specific Standard Circuit), and so on each of which has an information storage function. In addition, a device to which this invention is applicable can be applied to semiconductor devices such as a SOC (System On Chip), an MCP (Multi Chip Package), a POP (Package On Package), or the like. In addition, the transistors may be field effect transistors (FETs). The transistors can be applicable to various FETs such as not only MOS (Metal Oxide Semiconductor) but also MIS (Metal-Insulator Semiconductor), TFT (Thin Film Transistor), or the like. The transistors may be transistors other than the FETs. In addition, P-channel type transistors or PMOS transistors act on behalf of first conductive-type transistors while N-channel type transistors or NMOS transistors act on behalf of second conductive-type transistors. Furthermore, the semiconductor substrate is not limited to a P-type semiconductor substrate and may be an N-type semiconductor substrate, a semiconductor substrate having SOI (Silicon on Insulator), a semiconductor substrate other then those.

What is claimed is:

1. A semiconductor device comprising:
   a wiring substrate having a main surface, the wiring substrate including a plurality of first connection pads and a plurality of second connection pads which are formed on the main surface;
   a first semiconductor chip mounted over the main surface of the wiring substrate, the first semiconductor chip including a plurality of first electrode pads;
   a second semiconductor chip mounted over the main surface of the wiring substrate, the second semiconductor chip including a plurality of second electrode pads each of which has a size smaller than that of each of the plurality of first electrode pads;
   a plurality of first wires connecting the plurality of first electrode pads with the plurality of first connection pads, respectively, each of the plurality of first connection pads being connected to only one of the plurality of first wires; and
   a plurality of second wires connecting the plurality of second electrode pads with the plurality of second connection pads, respectively, the plurality of second wires having wide width parts at first ends thereof, each of the plurality of second connection pads being connected to only one of the plurality of second wires,
   wherein each of the plurality of first electrode pads is larger than each of the wide width parts of the plurality of second wires and each of the plurality of second electrode pads is smaller than each of the wide width part of the plurality of second wires,
   wherein the wide width parts of the plurality of second wires are connected to the plurality of second connection pads, respectively, and the plurality of second wires have second ends connected to the plurality of second electrode pads, respectively, via a plurality of bump electrodes which are smaller than the plurality of second electrode pads.

2. The semiconductor device as claimed in claim 1, wherein the first semiconductor chip and the second semiconductor chip are stacked over the main surface of the wiring substrate.

3. The semiconductor device as claimed in claim 2, wherein the second semiconductor chip is stacked over the main surface of the wiring substrate and the first semiconductor chip is stacked over the second semiconductor chip.

4. The semiconductor device as claimed in claim 3, wherein the first semiconductor chip is deviated and stacked over the second semiconductor chip so as to expose the plurality of second electrode pads.

5. The semiconductor device as claimed in claim 4, wherein the plurality of first electrode pads include a specific first electrode pad and the plurality of second electrode pads include a specific second electrode pad which has the same potential to the specific first electrode pad,
   wherein the plurality of first wires include a specific first wire which connects the specific first electrode pad with the specific second electrode pad.

6. The semiconductor device as claimed in claim 3, wherein the first semiconductor chip is stacked over the second semiconductor chip via a spacer.

7. The semiconductor device as claimed in claim 3, wherein the first semiconductor chip is stacked over the second semiconductor chip via an adhesive member which enables to embed the plurality of second wires.

8. The semiconductor device as claimed in claim 2, wherein the first semiconductor chip is stacked over the main surface of the wiring substrate and the second semiconductor chip is stacked over the first semiconductor chip.

9. The semiconductor device as claimed in claim 8, wherein the second semiconductor chip is deviated and stacked over the first semiconductor chip so as to expose the plurality of first electrode pads.

10. The semiconductor device as claimed in claim 1, wherein the first semiconductor chip and the second semiconductor chip are put on the main surface of the wiring substrate side by side.

11. A semiconductor device comprising:
a substrate including a plurality of connection pads on a main surface;
a first semiconductor chip mounted over the main surface of the substrate, the first semiconductor chip including a plurality of first electrode pads thereon;
a second semiconductor chip mounted over the main surface of the substrate, the second semiconductor chip including a plurality of second electrode pads thereon, each of the second electrode pads being smaller in width than each of the first electrode pads;
a plurality of first wires electrically connecting the connection pads to the first electrode pads of the first semiconductor chip, respectively, each of the plurality of first wires being connected to only one connection pad;
a plurality of bump electrodes provided on the second electrode pads of the second semiconductor chip, respectively; and
a plurality of second wires including first ends in contact with corresponding ones of the connection pads and second ends in contact with corresponding ones of the bump electrodes, and the first ends being larger in width than the second ends, each of the plurality of second wires being in contact with only one connection pad.

12. The semiconductor device as claimed in claim 11, wherein the first ends of the second wires are smaller in width than the first electrode pads of the first semiconductor chip and are larger in width than the second electrode pads of the second semiconductor chip.

13. The semiconductor device as claimed in claim 11, wherein the first wires include third ends and fourth ends that are larger in width than the third ends, and the fourth ends are in contact with corresponding ones of the first electrode pads of the first semiconductor chip.

14. The semiconductor device as claimed in claim 11, wherein the second semiconductor chip is mounted over the main surface of the substrate, and
the first semiconductor chip stacked over the second semiconductor chip.

15. The semiconductor device as claimed in claim 14, wherein the first semiconductor chip is deviated from the second semiconductor chip so as to expose the plurality of second electrode pads from the first semiconductor chip.

16. The semiconductor device as claimed in claim 14, further comprising:
a spacer is smaller in size than the first semiconductor chip, and the spacer is provided between the first and second semiconductor chips so as to expose the plurality of second electrode pads from the spacer.

17. The semiconductor device as claimed in claim 14, further comprising:
an adhesive layer provided between the first and second semiconductor chips, the second ends of the second wires and the bump electrodes are embedded in the adhesive layer.

18. The semiconductor device as claimed in claim 11, wherein the first semiconductor chip is mounted over the main surface of the substrate, and
the second semiconductor chip is stacked over the first semiconductor chip.

19. The semiconductor device as claimed in claim 13, wherein a selected one of the third ends of the first wires is in contact with a corresponding one of the second ends of the second wires, and the selected one of third ends of the first wires is electrically connected to a corresponding one of the connection pads via the corresponding one of the second wires.

20. The semiconductor device as claimed in claim 11, wherein the second semiconductor chip is mounted over the main surface of the substrate so as to dispose at a position differing from the first semiconductor chip.

21. The semiconductor device as claimed in claim 1, the plurality of second electrode pads are arranged at a pitch which is narrower than a pitch of the plurality of first electrode pads.

* * * * *